(12) United States Patent
Ngai et al.

(10) Patent No.: US 6,690,195 B1
(45) Date of Patent: *Feb. 10, 2004

(54) DRIVER CIRCUITRY FOR PROGRAMMABLE LOGIC DEVICES

(75) Inventors: Tony Ngai, Campbell, CA (US); Sergey Shumarayev, San Leandro, CA (US); Wei-Jen Huang, Burlingame, CA (US)

(73) Assignee: Altera Corporation, San Jose, CA (US)

( * ) Notice: Subject to any disclaimer, the term of this patent is extended or adjusted under 35 U.S.C. 154(b) by 25 days.

This patent is subject to a terminal disclaimer.

(21) Appl. No.: 10/047,810

(22) Filed: Jan. 15, 2002

Related U.S. Application Data

(63) Continuation of application No. 09/516,866, filed on Mar. 2, 2000, now Pat. No. 6,480,027.
(60) Provisional application No. 60/142,516, filed on Jul. 6, 1999, and provisional application No. 60/122,788, filed on Mar. 4, 1999.

(51) Int. Cl.[7] .......................................... H03K 19/177
(52) U.S. Cl. .......................................... 326/41; 326/38
(58) Field of Search .................................... 326/37–41

(56) References Cited

U.S. PATENT DOCUMENTS

| | | | |
|---|---|---|---|
| 3,473,160 A | 10/1969 | Wahlstrom | 340/172.5 |
| 4,642,487 A | 2/1987 | Carter | 326/41 |
| RE34,363 E | 8/1993 | Freeman | 326/38 |
| 5,414,312 A | 5/1995 | Wong | 326/83 |
| 5,455,525 A | 10/1995 | Ho et al. | 326/41 |
| 5,497,108 A | 3/1996 | Menon et al. | 326/84 |
| 5,541,530 A | 7/1996 | Cliff et al. | 326/41 |
| 5,543,732 A | 8/1996 | McClintock et al. | 326/41 |
| 5,592,106 A | 1/1997 | Leong et al. | 326/41 |
| 5,614,840 A | 3/1997 | McClintock et al. | 326/41 |
| 5,689,195 A | 11/1997 | Cliff et al. | 326/41 |
| 5,801,546 A | 9/1998 | Pierce et al. | 326/39 |
| 5,847,578 A | 12/1998 | Noakes et al. | 326/39 |
| 5,900,743 A | 5/1999 | McClintock et al. | 326/41 |
| 5,909,126 A | 6/1999 | Cliff et al. | 326/41 |
| 5,963,049 A | 10/1999 | Cliff et al. | 326/41 |
| 5,963,051 A | 10/1999 | Cliff et al. | 326/41 |
| 5,977,793 A | 11/1999 | Reddy et al. | 326/41 |
| 5,999,016 A | 12/1999 | McClintock et al. | 326/41 |
| 6,002,268 A | 12/1999 | Sasaki et al. | 326/41 |
| 6,025,736 A | 2/2000 | Vora et al. | 326/39 |
| 6,215,326 B1 | 4/2001 | Jefferson et al. | 326/41 |

OTHER PUBLICATIONS

U.S. patent application Ser. No. 09/516,921, Ngai et al., filed Mar. 2, 2000.
Virtex 2.5V Field Programmable Gate Arrays, Advance Product Specification, Oct. 20, 1998 (Version 1.0), Xilinx, Inc., San Jose, California.
"DY6000 Family, FAST Field Programmable Gate Array, DY6000 Family Datasheet", DynaChip Corporation, Dec. 1998.
Virtex 2.5V Field Programmable Gate Arrays, Advance Product Specification, Feb. 16, 1999 (Version 1.3), Xilinx, Inc., San Jose, California.
Virtex–E 1.8V Field Programmable Gate Arrays, Advance Product Specification, DS022 (v1.3) Feb. 29, 2000, Xilinx, Inc., San Jose, California.

*Primary Examiner*—Don Le
(74) *Attorney, Agent, or Firm*—Fish & Neave; Robert R. Jackson; Jeffrey C. Aldridge

(57) ABSTRACT

Driver circuitry for programmable logic devices may include a module comprising a driver and associated hardware-programmable input and/or output routing connections. Instances of the generalized driver module may be included anywhere on the programmable logic device that driver circuitry having characteristics within the capabilities of the generalized module is needed. The circuitry of each instance of the module is hardware-customized to match the driver characteristics required for that instance. Driver circuits may be distributed throughout the interconnection conductor resources of the programmable logic device in such a way as to optimize re-buffering of signals propagating through those resources.

36 Claims, 6 Drawing Sheets

DRIVER CIRCUITRY FOR PROGRAMMABLE LOGIC DEVICES

This is a continuation of U.S. patent application Ser. No. 09/516,866, filed Mar. 2, 2000, now U.S. Pat. No. 6,480,027 which is hereby incorporated by reference in its entirety. This application claims the benefit of U.S. provisional patent application No. 60/122,788, filed Mar. 4, 1999, and U.S. provisional patent application No. 60/142,516, filed Jul. 6, 1999, both of which are hereby incorporated by reference herein in their entireties.

BACKGROUND OF THE INVENTION

This invention relates to programmable logic integrated circuitry devices, and more particularly to driver circuitry for use in such devices.

As is well known to those skilled in the art, programmable logic devices typically include many regions of programmable logic and programmable interconnection resources for selectively conveying signals to, from, and between the logic regions. Each logic region is programmable to perform any of several relatively simple logic operations on input signals applied to the logic region in order to produce one or more logic region output signals. The interconnection resources are programmable to interconnect the logic regions in any of many different configurations so that very complex logic tasks can be performed by concatenating the logic regions in various ways.

Examples of programmable logic devices are shown in Cliff et al. U.S. Pat. No. 5,689,195, Cliff et al. U.S. Pat. No. 5,909,126, Cliff et al. U.S. Pat. No. 5,963,049, Jefferson et al. U.S. Pat. No. 6,215,326, and Ngai et al. U.S. patent application Ser. No. 09/516,921, filed Mar. 2, 2000, all of which are hereby incorporated by reference herein in their entireties.

At various locations in the interconnection resources of programmable logic devices signals may need to be strengthened in order to propagate along a relatively long interconnection conductor or to continue to propagate along such a conductor or succession of conductors. Such signal strengthening is variously referred to as buffering, re-buffering, driving, or the like, and it may be produced by circuit elements that are variously called buffers, drivers, tri-state drivers, or the like. In general, these various terms are used interchangeably herein. There are many different places in a programmable logic device at which signal buffering may be needed. For example, the output signal of a logic region may need buffering to enable it to better drive an interconnection conductor. A signal reaching the end of an interconnection conductor segment may need to be buffered so that it can drive the next interconnection conductor segment. A signal turning from a horizontal interconnection conductor segment to a vertical interconnection conductor segment (or vice versa) may need to be buffered so that it can drive the receiving segment. Signals received by the device from external circuitry may need buffering, and signals that will be output signals of the device may need buffering in order to drive external circuitry.

Heretofore the driver circuitry needed in each circuit context has generally been designed specifically for that context. This can lead to a proliferation of buffer circuit designs, which can in turn increase the difficulty of laying out and otherwise designing a new programmable logic device.

In view of the foregoing, it is an object of this invention to improve and simplify the design of programmable logic devices.

It is a more particular object of this invention to provide improved and simplified (e.g., by virtue of being more standardized) driver circuitry for programmable logic devices.

SUMMARY OF THE INVENTION

These and other objects of the invention are accomplished in accordance with the principles of the invention by providing a driver circuit module for programmable logic devices, which can be adapted to perform any of several different tasks, and which module can therefore be used in any of several different contexts in a programmable logic device. The generalized driver module of this invention has the capability of driving a signal from any of several sources (e.g., an adjacent region of programmable logic or adjacent ends of interconnection conductors) to any of several destinations (e.g., adjacent ends of interconnection conductors). Each instance of the driver module on the programmable logic device is hardware-configurable to meet the requirements of that particular instance. For example, the hardware configuration or hardware programming of an instance of the driver module may include providing the metal in the module needed to complete certain connections while omitting the metal needed for other connections.

Another aspect of the invention relates to the manner in which driver modules, interconnection conductors, and logic regions are disposed on a programmable logic device and inter-related. In this aspect the driver modules can be either the hardware-configurable modules described briefly in the preceding paragraph, or they can be software-programmable driver modules (e.g., of known design). A plurality of logic regions are disposed on the programmable logic device in a row. A plurality of interconnection conductor channels extend along the row. The interconnection conductors in each of the channels are interrupted at spaced locations along the row by driver modules. Each driver module is adjacent a respective one of the logic regions and can drive a signal from the adjacent logic region or the conductors interrupted by that driver module onto some or all of the conductors interrupted by that module. The modules in the various channels are preferably offset from one another along the row. The spacing of the spaced locations in each channel is preferably uniform for all channels and equal to the spacing between logic regions that are separated from one another by several other logic regions. This spacing is also preferably an optimal or at least desirable spacing for re-buffering signals that must be propagated more than one conductor-segment-length along a conductor channel. The driver modules are preferably the sole means by which signals can be driven onto the conductors. This arrangement of logic regions, interconnection conductors, and driver modules has a great many advantages such as improving signal propagation timing uniformity and predictability.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
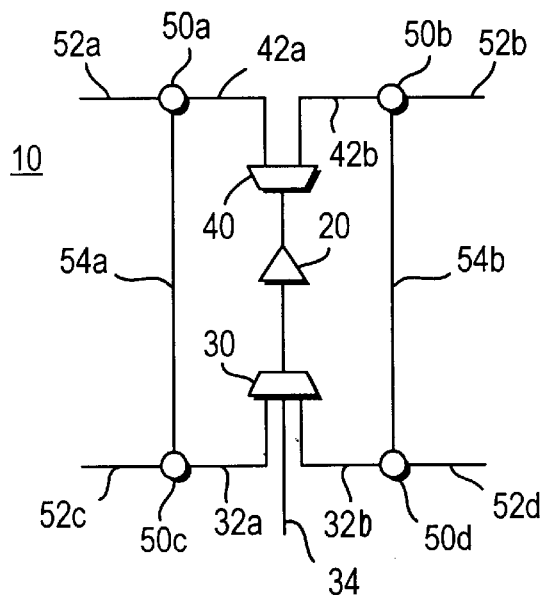
FIG. 1 is a simplified schematic block diagram of an illustrative embodiment of a driver module in accordance with the invention.

An illustrative embodiment of a driver module 10 in accordance with this invention is shown in FIG. 1. Module 10 includes driver circuitry 20, input selection circuitry 30 for selecting any one of several input signals 32a, 32b, and 34 for application to the input terminal of driver circuitry 20, and output routing circuitry 40 for routing the output signal of driver circuitry 20 to either or both of two output leads 42a and 42b. Driver module 10 also includes four interconnection areas 50a–50d. Within each of these areas 50 each lead 32/52/54 or 42/52/54 extending to the area is connectable to either one or both of the other leads extending to that area. Leads 54a and 54b are bridge connections extending between interconnection areas 50a/50c and 50b/50d, respectively.

Driver module 10 has many possible uses within a programmable logic device. For example, each of leads 52a–d may be a different interconnection conductor of the programmable logic device. Thus lead 52a may be a relatively long horizontal interconnection conductor extending to the left from module 10; lead 52b may be a relatively long horizontal interconnection conductor extending to the right from module 10; lead 52c may be a relatively short horizontal interconnection conductor extending to the left from module 10; and lead 52d may be a relatively short horizontal interconnection conductor extending to the right from module 10. Lead 34 may receive an output signal from a region of programmable logic adjacent to module 10.

In the design of a programmable logic device, driver modules generally like module 10 can be placed anywhere that driver capabilities supportable by such a module are needed. Thereafter in the design of the programmable logic device, each of these generalized driver modules 10 can be customized to provide the connections needed at that particular driver module instance. This customization of each driver module includes making appropriate hardware connections to the module and configuring the hardware of the module in the manner appropriate to the task it must perform. For example, appropriate interconnection conductors may be used for leads 52, and an appropriate logic region output signal may be used for lead 34. Similarly, the hardware represented by elements 30 and 40 is configured to make the desired input and output connections to and from driver circuitry 20. The hardware represented by each of elements 50 is also configured to make the desired connections among the leads to that element. In certain cases elements that are completely unneeded may be omitted. For example, one or both of conductors 54a/b may be omitted if not needed, or some of elements 50 may be similarly omitted. In the design and fabrication of the programmable logic device that uses driver module 10, different metal connection selections may be made for the various instances of module 10 to hardware-customize each instance of the module as is appropriate for that instance.

Figure 2A:
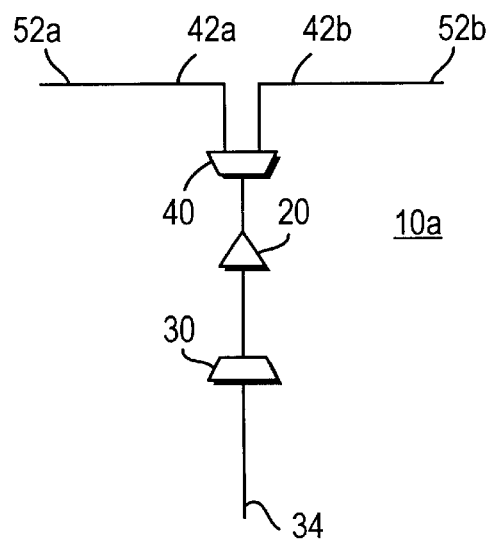
FIG. 2a is a simplified schematic block diagram showing a first illustrative customization of the module of FIG. 1 in accordance with the invention.

Examples of specific hardware versions of generalized driver module 10 are shown in FIGS. 2a–2e. For example, FIG. 2a shows hardware-configuration of a driver module 10a for use in driving relatively long left- and right-extending horizontal interconnection conductors 52a and 52b from a logic region output connected to lead 34. In this example the hardware of element 30 is configured to apply the signal on lead 34 to the input of driver circuitry 20; the hardware of element 40 is configured to apply the output signal of driver circuitry 20 to both of leads 42; and each of areas 50a and 50b is configured to connect the associated leads 42 and 52. Elements of generalized driver module 10 that are not used in FIG. 2a are omitted from that FIG. and can be similarly omitted from the actual circuitry of the programmable logic device for this instance of the driver module if desired.

Figure 2B:
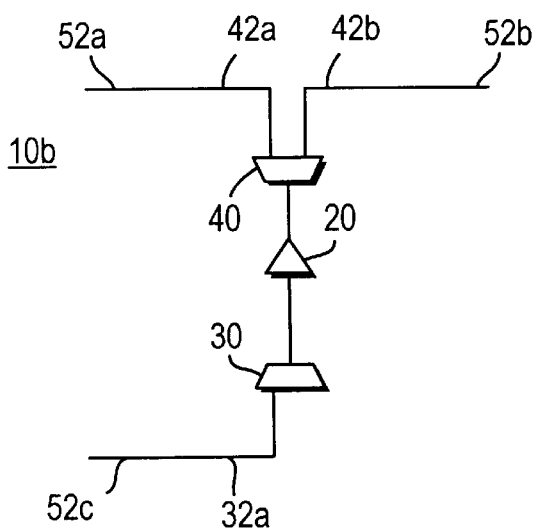
FIG. 2b is similar to FIG. 2a but shows a second illustrative customization of the FIG. 1 module in accordance with the invention.

FIG. 2b shows an example of customization of the hardware of a driver module 10 for use of the module to drive relatively long left- and right-extending horizontal interconnection conductors 52a and 52b from relatively short left-extending horizontal interconnection conductor 52c. Thus in customized driver module 10b the hardware represented by elements 50c and 30 is configured to apply the signal on conductor 52c to the input terminal of driver circuitry 20, and the hardware represented by elements 40, 50a, and 50b is configured to apply the output signal of driver circuitry 20 to both of conductors 52a and 52b. Again, elements of generalized driver module 10 that are not used in customized driver module 10b are not shown in FIG. 2b and can be omitted from the programmable logic device for this instance of the driver module if desired.

Figure 2C:
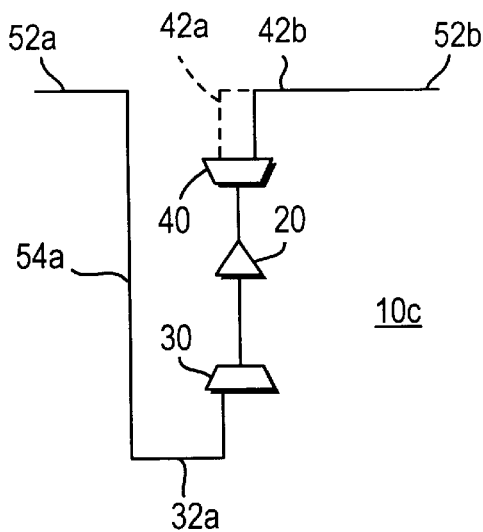
FIG. 2c is again similar to FIG. 2a but shows a third illustrative customization of the FIG. 1 module in accordance with the invention.

FIG. 2c shows an example of customization of the hardware of a generalized driver module 10 for use in re-buffering the signal from relatively long left-extending horizontal conductor 52a for application to relatively long right-extending horizontal conductor 52b. In this instance the hardware represented by elements 50a, 50c, and 30 is configured to apply the signal on conductor 52a to the input terminal of driver circuitry 20 via leads 54a and 32a. Similarly, the hardware represented by elements 40 and 50b is configured to apply the output signal of driver circuitry 20 to conductor 52b via lead 42b. (If desired to improve the driving capability, the circuitry shown in FIG. 2c can be further configured as indicated by the dotted line connection 42a to connect both output legs of the circuitry represented by element 40 to conductor 52b.) Once again, elements of the generalized driver module 10 that are not used in FIG. 2c are omitted from that FIG. and can be similarly omitted from the programmable logic device for instances of customized driver module 10c if desired.

Figure 2D:
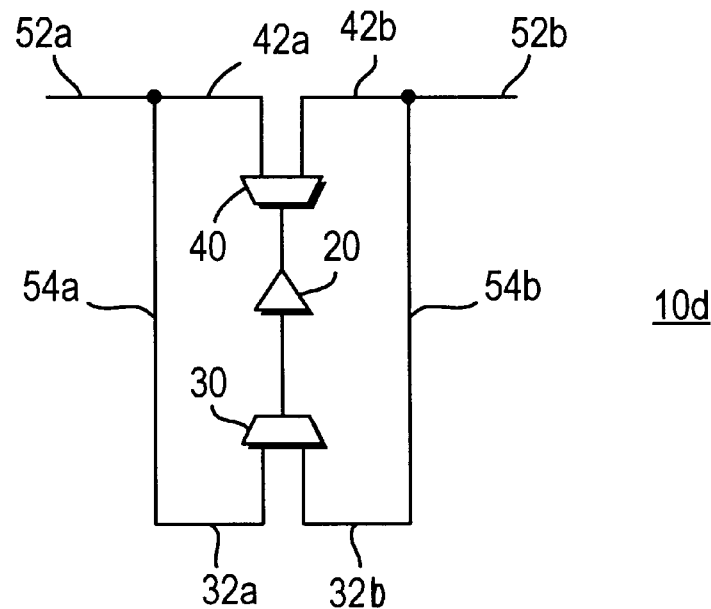
FIG. 2d is once again similar to FIG. 2a but shows a fourth illustrative customization of the FIG. 1 module in accordance with the invention.

FIG. 2d is similar to FIG. 2c except that it shows hardware-configuration of a driver module for use in bi-directional re-buffering between two relatively long horizontal conductors 52a and 52b.

Figure 2E:
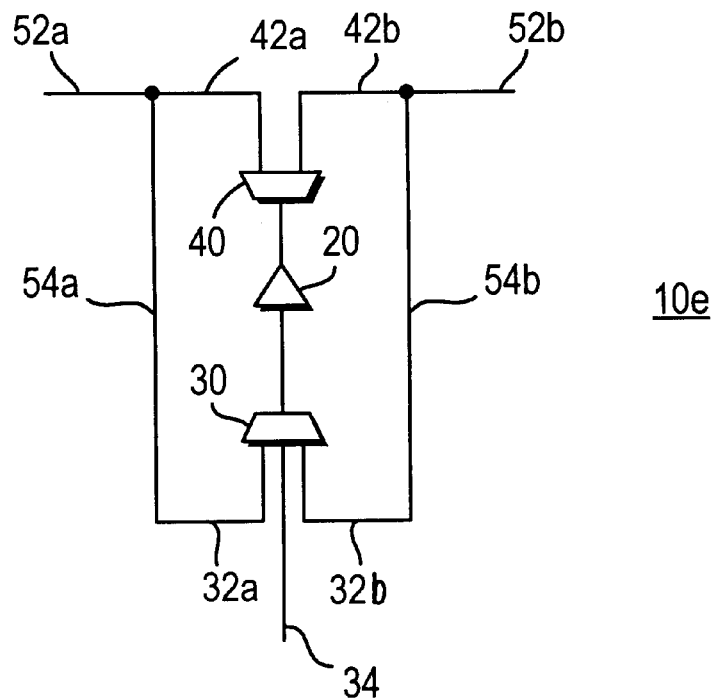
FIG. 2e is similar to FIG. 2d but shows yet another illustrative customization of the FIG. 1 module in accordance with the invention.

FIG. 2e is similar to FIG. 2d except that it shows hardware-configuration of a driver module as what may be called a "tri-directional" buffer 10e. Buffer 10e acts like a bi-directional buffer (as in FIG. 2d), plus a logic input via lead 34 can reach either or both of the left and right routing conductors 52a and 52b.

Figure 3:
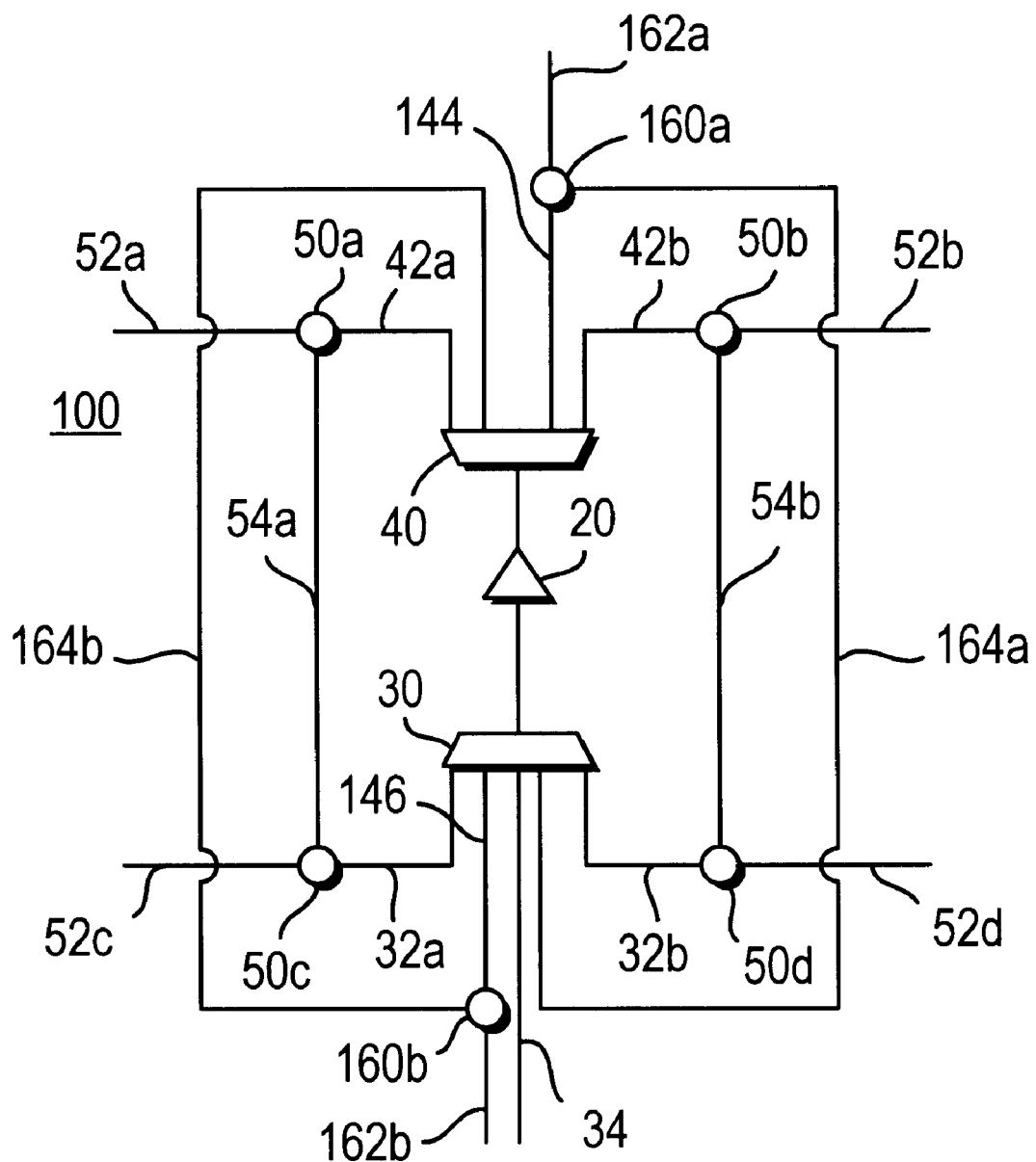
FIG. 3 is a simplified schematic block diagram of another illustrative embodiment of a driver module in accordance with the invention.

FIG. 3 shows an alternative embodiment of a generalized driver module 100 in accordance with the invention. Driver module 100 has all the same (or similar) elements that driver module 10 has. In FIG. 3 those elements that are essentially repeated from FIG. 1 have the same reference numbers that are used in FIG. 1. In addition to those elements, however, driver module 100 also has other elements. These additional elements have reference numbers in the 100 series. The additional elements of driver module 100 enable that module to additionally serve other interconnection conductors. For example, conductor 162a may be an upwardly extending vertical interconnection conductor on a programmable logic device, and conductor 162b may be a downwardly extending vertical interconnection conductor on the device. Each of elements 160a and 160b may be similar to any of above-described elements 50. Leads 144 and 164b are additional output connections from element 40, while leads 146 and 164a are additional inputs to element 30.

With the addition of possible connections to vertical interconnection conductors 162, driver module 100 can be hardware-customized to perform still more tasks. For example, driver module 100 can be used to drive the output signal 34 of a logic region onto one or both of vertical conductors 162a and 162b. Alternatively, driver module 100 can be used to drive a signal from any of horizontal interconnection conductors 52a–d onto either or both of vertical interconnection conductors 162a and 162b. As still another alternative, driver module 100 can be used to drive a signal from either of vertical interconnection conductors 162 onto any or all of horizontal conductors 52a–d. Or driver module 100 can be use for uni-directional re-buffering in either direction between vertical interconnection conductors 162, or for bi-directional re-buffering between those two vertical interconnection conductors. Whatever the task to be performed by any instance of driver module 100, the hardware of the various elements of that driver module instance are configured appropriately to that task in the same general way that various exemplary instances of driver module 10 are customized in FIGS. 2a–2e.

Although leads 34 are illustratively described above as conveying logic region output signals, leads 34 may be alternatively used for other types of signals such as input signals from circuitry that is external to the device that includes the driver modules or from other interconnection conductors on the device. Similarly, one or more of leads 52 or 162 may convey input and/or output pin signals of the device.

Figure 4:
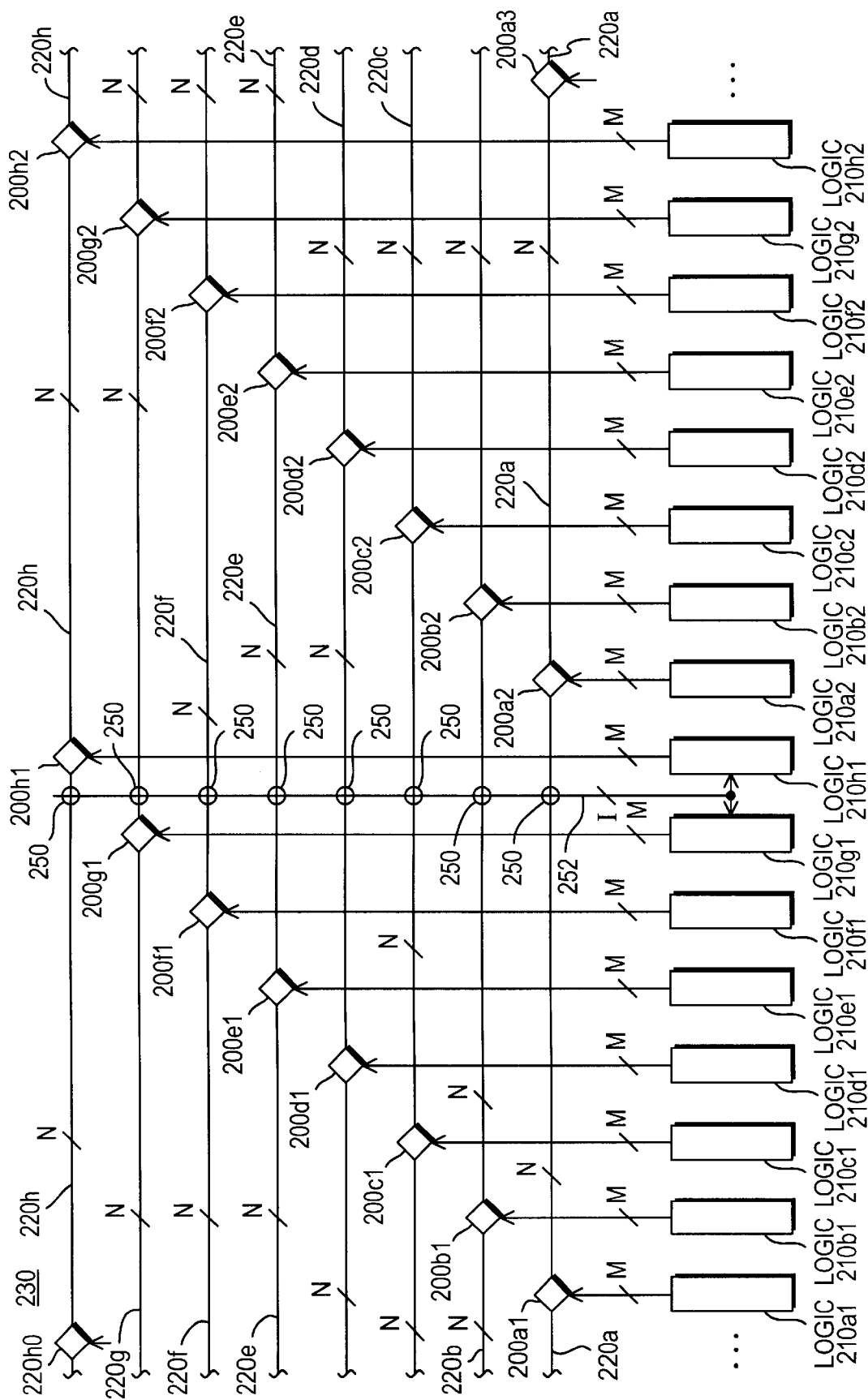
FIG. 4 is a simplified schematic block diagram of representative portions of an illustrative embodiment of a programmable logic device constructed in accordance with the invention.

Another aspect of the invention is illustrated by FIG. 4. This FIG. shows a representative portion of programmable logic and programmable interconnection circuitry on a programmable logic device 230. In particular, FIG. 4 shows several representative regions of programmable logic 210 in one representative row of such regions on device 230. FIG. 4 also shows horizontal interconnection conductors 220 that are associated with the depicted row of logic regions 210 and that are provided for conveying signals to, from, and/or between the logic regions in the row. Each of diamonds 200 represents one or more instances of driver modules 10 or 100 or any other suitable driver circuitry. Each of logic regions 210 can receive input signals from any of the adjacent conductors via programmable logic connectors 250 and region-feeding conductors 252. (Only a very few representative ones of elements 250 and 252 are shown in FIG. 4 to avoid over-crowding the drawing.)

Each logic region 210 produces one or more output signals (i.e., M output signals in the general case) which are applied to N instances of driver modules 200 that are associated with that logic region. For example, logic region 210a1 produces M output signals that are applied to N instances 200a1 of the driver module. N is typically at least equal to M so that each logic region output signal is applied to at least a respective one of driver modules 200. Preferably N is greater than M so that each logic region output signal can be applied to a respective two or more instances of driver module 200. There may also be some overlap between the instances of driver modules 200 that are used for each logic region output signal. In other words, a driver module 200 may receive more than one of the associated logic region output signals. (For ease of reference herein it is assumed that M and N are both greater than one, although it will be understood that M can be one and that N can also be one if desired.)

Each instance of a driver module 200 is disposed between a leftward extending horizontal interconnection conductor 220 and a rightward extending horizontal interconnection conductor 220. For example, each instance of driver module 200a1 is disposed between one of N horizontal conductors 220 extending to left from driver modules 200a1 and one of N horizontal conductors 220 extending to the right from those driver modules.

The driver modules 200 associated with each of logic regions 210 are located in the same layout tile. Thus, when, in the design of a device that uses the FIG. 4 circuitry, tiles are "copied and pasted" to form rows of regions 210, driver modules 200 are automatically evenly distributed across each row. These hardware-configurable driver modules can then be metal-configured differently to meet the different requirements in different regions. In the depicted embodiment the pattern of driver modules 200 repeats after eight horizontally adjacent logic regions 210. Thus each conductor 220 extends from a driver module 200 past seven adjacent logic regions 210 before encountering another driver module 200 associated with an eighth adjacent logic region 210. As a specific example of this consider a conductor 220e located near the center of FIG. 4. Such a conductor extends to the right from a driver module instance 200e1 past logic regions 210f1, 210g1, 210h1, 210a2, 210b2, 210c2, and 210d2 to a driver module instance 200e2.

The effect of the pattern of driver modules 200 and conductors 220 shown in FIG. 4 is to make all of conductors 220 the same length between horizontally adjacent driver modules. This conductor length can be chosen to be the optimal length for a conductor before the signal on that conductor needs to be re-buffered. With an arrangement of the type shown in FIG. 4 it is known that each logic region output signal is always driven onto the end of a conductor segment 220. It is also known that the remote end of that conductor segment 220 is a fixed distance away from the input end and that a re-buffering driver module 200 is available at that remote end for re-buffering the signal onto another horizontally adjacent segment if the signal needs to be propagated beyond the circuitry reachable from the first segment.

As a specific example of the foregoing, consider an output signal from logic region 210e1. Such a signal can be applied to the left-hand end of a conductor segment 220e extending to the right from a driver module 200e1. The signal on that conductor segment 220e can be applied to any of the logic regions 210f1–210d2 (and possibly also 210e1 and 210e2) by logic-region-feeding conductors like conductors 252. At the right-hand end of the conductor segment 220e being discussed that conductor segment encounters a driver module 200e2. If the signal on the conductor segment 220e being discussed is needed by logic regions 210 farther to the right, the immediately above-mentioned driver module 200e2 can be used to re-buffer that signal and to apply the re-buffered signal to another conductor segment 220e extending to the right from that driver module.

Because the starting point of the signal on each conductor segment 220 is always adjacent one end of that segment, because the conductor segments are of known length, because a driver module 200 is available at each end of each segment, and because the conductor segment lengths are selected so that a signal traversing the length of a conductor segment will be in need of re-buffering as it reaches a driver module 200 capable of providing that re-buffering, an arrangement of elements like that shown in FIG. 4 helps make signal propagation throughout device 230 more uniform and predictable. In addition, once a signal is on a conductor segment 220, it is known that the signal is available to a substantial number of logic regions 210 (i.e., all the logic regions passed by that conductor segment) without any further driver delays being introduced into at least that much propagation of the signal. All of these considerations facilitate reliable, high-speed operation of device 230.

Figure 5:
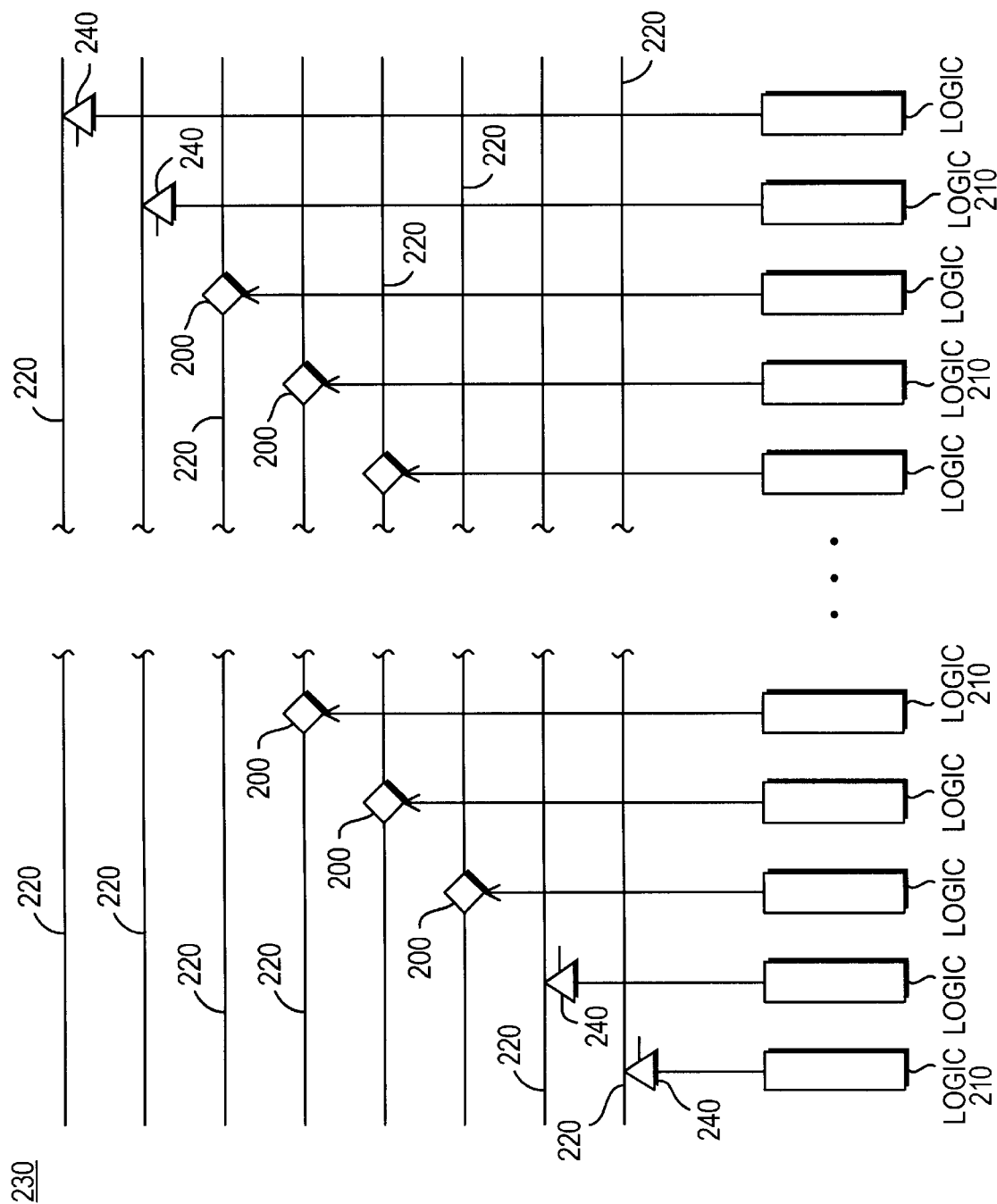
FIG. 5 is generally similar to FIG. 4 but illustrates other possible aspects of the invention.

It will be appreciated that adjacent the edges of device 230 some of conductor segments 220 will have to be made shorter than the length otherwise used for such segments. However, at these locations bi-directional re-buffering capabilities may not be needed. Accordingly, instances of driver modules 200 adjacent the edges of device 230 can be hardware-configured as tri-state drivers (e.g., for selectively driving signals from input pins, input/output pins, or adjacent logic regions 210 onto conductor segments 220, or for selectively driving signals from such conductor segments 220 onto output or input/output pins). FIG. 5 shows an example of inclusion of such tri-state drivers 240 near edges of device 230. FIG. 5 also shows relatively short edge segments of conductors 220 short-circuited to the adjacent longer segments of those conductors to eliminate the overhead of re-buffering for very short segments of wire. This short-circuiting is shown for the two lower left and two upper right conductor groups in FIG. 5. These are also the conductor groups shown with tri-state drivers 240.

Some of the advantages of the circuitry of this invention are as follows: 1. it eliminates delay overhead of crossing fixed re-buffering or hierarchical boundaries; 2. it provides optimal buffering from source and destination points, whether the destination point is before or after several staggered drivers; 3. it provides higher noise immunity because it allows shielding of signal drivers from unused wires and also shields from unused diffusion loading; 4. it decreases routing channel requirements when unstitched metal lines (e.g., horizontally adjacent conductor segments 220) can be used independently; and 5. it can improve speed by re-distributing fan-out (because non-critical paths can be off-loaded by turning onto another driver using a lead 34 to convey a signal from one interconnection conductor to another).

Figure 6:
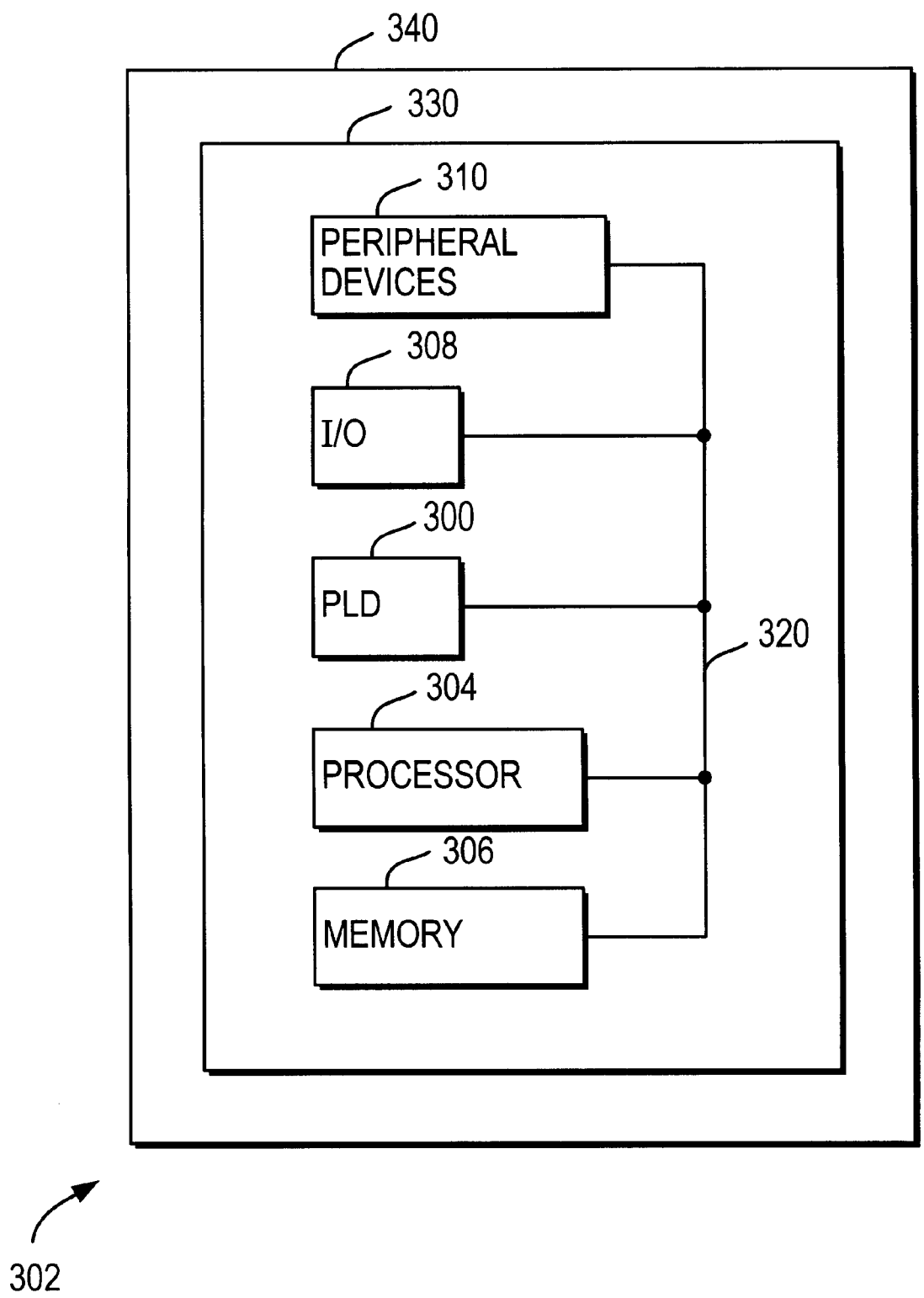
FIG. 6 is a simplified block diagram of an illustrative system employing a programmable logic device in accordance with the invention.

FIG. 6 illustrates a programmable logic device 300 constructed in accordance with the present invention in a data processing system. Thus device 300 may be constructed using hardware-configurable driver modules like those shown in FIGS. 1–3 and/or with driver module arrangements like those shown in FIGS. 4 and/or 5. Data processing system 302 may include one or more of the following components: a processor 304; memory 306; I/O circuitry 308; and peripheral devices 310. These components are coupled together by a system bus 320 and are populated on a circuit board 330 which is contained in an end-user system 340.

System 302 can be used in a wide variety of applications, such as computer networking, data networking, instrumentation, video processing, digital signal processing, or any other application where the advantage of using programmable or reprogrammable logic is desirable. Programmable logic device 300 can be used to perform a variety of different logic functions. For example programmable logic device 300 can be configured as a processor or controller that works in cooperation with processor 304. Programmable logic device 300 may also be used as an arbiter for arbitrating access to a shared resource in system 302. In yet another example, programmable logic device 300 can be configured as an interface between processor 304 and one of the other components in system 302. It should be noted that system 302 is only exemplary, and that the true scope and spirit of the invention should be indicated by the following claims.

It will be understood that the foregoing is only illustrative of the principles of the invention, and that various modifications can be made by those skilled in the art without departing from the scope and spirit of the invention. For example the driver modules 200 used as shown in FIGS. 4 and 5 do not have to be the hardware-configurable driver modules shown in the earlier FIGS. Instead, driver modules 200 can be programmably controlled driver circuits (e.g., those shown in FIG. 8 of Reddy et al. U.S. Pat. No. 5,977,793, which is hereby incorporated by reference herein in its entirety).

Most programmable logic devices have more than one row of logic regions, thereby creating a two-dimensional array of intersecting rows and columns of logic regions. Vertical interconnection conductors (like conductors 162 in FIG. 3) may be associated with the columns of logic regions, and a vertically offset or staggered driver module pattern analogous to the horizontally offset or staggered patterns shown in FIGS. 4 and 5 may be alternatively or additionally employed in the vertical interconnection conductors.

It will be understood that various directional and orientational terms such as "vertical" and "horizontal", "left" and "right", "row" and "column", and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of the invention.

It will also be understood that any suitable logic can be used in logic regions 210. For example, sum-of-products logic, look-up table logic, or any other type of logic can be used. Similarly, any of many different technologies can be used to make devices in accordance with the invention. Examples of suitable technologies include EPROMs, EEPROMs, pass transistors, transmission gates, fuses, antifuses, laser fuses, metal optional links, SRAMs, DRAMs, FIFO memories, function control registers (e.g., as in Wahlstrom U.S. Pat. No. 3,473,160), ferro-electric memories, and the like. The programmable logic devices of this invention can be one-time-only programmable or reprogrammable.

The invention claimed is:

1. Driver module circuitry comprising:
   driver circuitry having an input terminal and an output terminal;
   hardware-configurable input signal selection circuitry configured for hardware configuration to select for application to the input terminal any of a plurality of input signals to the driver module circuitry; and
   hardware-configurable output signal routing circuitry configured for hardware configuration to select any of a plurality of output destinations of the driver module circuitry to receive a signal from the output terminal,
   wherein the input signals that are selectable for application to the input terminal may be received from any of the plurality of output destinations.

2. The driver module circuitry defined in claim 1 wherein each of the input signals is received by the driver module circuitry via a respective one of a plurality of physically separate leads of the driver module circuitry.

3. The driver module circuitry defined in claim 1 wherein each of the output destinations is a respective one of a plurality of physically separate leads of the driver module circuitry.

4. The driver module circuitry defined in claim 1 further comprising:
   hardware-configurable bridge circuitry configured to hardware-selectively apply a signal from at least one of the output destinations as at least one of the input signals to the driver module circuitry.

5. A programmable logic device comprising:
   a plurality of regions of programmable logic;
   a plurality of interconnection conductors configured to selectively convey signals to, from, and between the logic regions; and
   driver module circuitry as defined in claim 1 and configured to apply at least one signal from at least one signal source which is hardware-selected from the logic regions and interconnection conductors to at least one signal utilizer which is hardware-selected from the interconnection conductors.

6. The programmable logic device defined in claim 5 wherein the driver module circuitry is one of a plurality of driver module circuitries defined in the same way, and wherein each of the interconnection conductors has one of the driver module circuitries disposed adjacent each end of that interconnection conductor and configured for hardware-selectable connection to the adjacent end of that interconnection conductor.

7. The programmable logic device defined in claim 6 wherein each of the driver module circuitries is disposed adjacent an end of each of two of the interconnection conductors, and wherein each of the driver module circuitries is further configured to hardware-selectively pass a signal from at least one of the adjacent interconnection conductor ends through the driver circuitry of the module to at least another of the adjacent interconnection conductor ends.

8. The programmable logic device defined in claim 7 wherein the two interconnections conductors having ends adjacent each of the driver module circuitries extend in different directions from that driver module circuitry.

9. The programmable logic device defined in claim 7 wherein each of the driver module circuitries is additionally disposed adjacent a respective one of the logic regions, and wherein each of the driver module circuitries is additionally configured to hardware-selectively apply a signal from the adjacent logic region through the driver circuitry of the module to at least one of the adjacent interconnection conductor ends.

10. The programmable logic device defined in claim 7 wherein each of the driver module circuitries is disposed adjacent an end of each of four of the interconnection conductors.

11. The programmable logic device defined in claim 7 wherein each of the driver module circuitries is disposed adjacent an end of each of six of the interconnection conductors.

12. The programmable logic device defined in claim 10 wherein each of the four interconnection conductors having an end adjacent each of the driver module circuitries extends in a respective one of four principal compass directions from that driver module circuitry.

13. A digital processing system comprising:
    processing circuitry;
    a memory coupled to the processing circuitry; and
    a programmable logic device as defined in claim 5 coupled to the processing circuitry and the memory.

14. A printed circuit board on which is mounted a programmable logic device as defined in claim 5.

15. The printed circuit board defined in claim 14 further comprising:
    a memory mounted on the printed circuit board and coupled to the programmable logic device.

16. The printed circuit board defined in claim 14 further comprising:
    processing circuitry mounted on the printed circuit board and coupled to the programmable logic device.

17. Driver module circuitry comprising:
    a driver circuit having an input and an output;
    an input selection circuit having at least one input and an output, said input selection circuit output connected electronically to said driver circuit input;
    an output routing circuit having at least an input and at least one output, said output routing circuit input connected electronically to said driver circuit output;
    first, second, third, and fourth interconnection areas;
    first, second and third input leads, said first input lead electronically connecting said first interconnection area and said input selection circuit input, said second input lead being connected electronically to said input selection circuit input, and said third input lead electronically connecting said second interconnection area and said input selection circuit input;
    first, second and third output leads, said first output lead electronically connecting said third interconnection area and said output routing circuit output, said second output lead being connected electronically to said output routing circuit output, and said third output lead electronically connecting said fourth interconnection area and said output routing circuit output; and
    first and second bridge connections, said first bridge connection electronically connecting said first interconnection area and said third interconnection area, said second bridge connection electronically connecting said second interconnection area and said fourth interconnection area.

18. The driver module circuitry of claim 17, further comprising:
    fifth and sixth interconnection areas, said fifth interconnection area being connected electronically to said second input lead, said sixth interconnection area being connected electronically to said second output lead; and third and fourth bridge connections, said third bridge connection electronically connecting said fifth interconnection area and said output routing circuit output, said fourth bridge connection electronically connecting said sixth interconnection area and said input selection circuit input.

19. A programmable logic device comprising:

a plurality of regions of programmable logic disposed on the device in a row along a first axis; and a number of interconnection conductor channels extending substantially parallel to the first axis, each of the channels being spaced apart from one another along a second axis that is substantially perpendicular to the first axis, wherein each of the channels comprises:

conductors being interrupted at spaced locations along the first axis by driver circuitry modules, each of which is (i) adjacent one of said logic regions, and (ii) configured to selectively drive at least one input signal to at least one output destination, the input signal being selectable from an output signal of the adjacent logic region and the conductors extending in each direction from the driver circuitry module along the first axis, and the output destination being selectable from the conductors extending in each direction from the driver circuitry module along the first axis.

20. The programmable logic device defined in claim 19 wherein the channels are spaced apart substantially uniformly along the second axis.

21. The programmable logic device defined in claim 19 wherein the spaced locations are substantially uniformly spaced in each of the channels.

22. The programmable logic device defined in claim 21 wherein the spaced locations in each of the channels are offset along the first axis from the spaced locations in each of the other channels.

23. The programmable logic device defined in claim 22 wherein each of the logic regions is adjacent a respective one of the spaced locations.

24. The programmable logic device defined in claim 23 wherein each of the spaced locations is adjacent a respective one of the logic regions.

25. The programmable logic device defined in claim 24 wherein two consecutively spaced locations in each channel along the first axis are adjacent ones of the logic regions that are separated from one another by a number of other ones of the logic regions.

26. The programmable logic device defined in claim 25 wherein the number of other ones of the logic regions is one less than the number of channels.

27. The programmable logic device defined in claim 26 wherein the driver circuitry modules are substantially the sole means by which signals can be applied to the conductors.

28. The programmable logic device defined in claim 19 wherein each of a number of consecutive logic regions along the first axis is adjacent a different one of a number of spaced locations, wherein each of the number of spaced locations is in a different one of the number of channels, wherein the number of consecutive logic regions is equal to the number of spaced locations, and wherein the number of spaced locations is equal to the number of channels.

29. The programmable logic device defined in claim 19 wherein a conductor that extends between any two consecutively spaced locations in any one of the channels spans a substantially unique group of the plurality of logic regions along the first axis.

30. The programmable logic device defined in claim 29 wherein each group of logic regions includes a plural number of logic regions.

31. The programmable logic device defined in claim 19 wherein the spaced locations in each of the channels are offset along the first axis from the spaced locations in each of the other channels.

32. The programmable logic device defined in claim 31 wherein each of the logic regions is adjacent a respective one of the spaced locations.

33. The programmable logic device defined in claim 32 wherein each of the spaced locations is adjacent a respective one of the logic regions.

34. The programmable logic device defined in claim 33 wherein two consecutively spaced locations in each channel along the first axis are adjacent ones of the logic regions that are separated from one another by a number of other ones of the logic regions.

35. The programmable logic device defined in claim 34 wherein the number of other ones of the logic regions is one less than the number of channels.

36. The programmable logic device defined in claim 35 wherein the driver circuitry modules are substantially the sole means by which signals can be applied to the conductors.

* * * * *